(12) United States Patent
Kim et al.

(10) Patent No.: US 12,016,390 B2
(45) Date of Patent: Jun. 25, 2024

(54) AEROSOL GENERATING DEVICE AND HEATER ASSEMBLY FOR AEROSOL GENERATING DEVICE

(71) Applicant: KT&G CORPORATION, Daejeon (KR)

(72) Inventors: Tae Hun Kim, Yongin-si (KR); Hun Il Lim, Seoul (KR); Jong Sun Park, Suwon-si (KR)

(73) Assignee: KT&G CORPORATION, Daejeon (KR)

( * ) Notice: Subject to any disclaimer, the term of this patent is extended or adjusted under 35 U.S.C. 154(b) by 0 days.

(21) Appl. No.: 18/316,517

(22) Filed: May 12, 2023

(65) Prior Publication Data

US 2023/0276849 A1     Sep. 7, 2023

Related U.S. Application Data

(63) Continuation of application No. 16/759,439, filed as application No. PCT/KR2018/012809 on Oct. 26, 2018, now Pat. No. 11,672,278.

(30) Foreign Application Priority Data

Oct. 30, 2017   (KR) .......................... 10-2017-0142578
May 14, 2018   (KR) .......................... 10-2018-0055120

(51) Int. Cl.
*A24F 40/46*     (2020.01)
*A24B 15/167*   (2020.01)
(Continued)

(52) U.S. Cl.
CPC ............ *A24F 40/46* (2020.01); *A24B 15/167* (2016.11); *A24D 1/20* (2020.01); *A24D 3/17* (2020.01);
(Continued)

(58) Field of Classification Search
CPC .......... A24F 40/60; A24F 40/65; A24F 40/46; A24F 40/42; A24F 40/40; A24F 15/01; A24F 40/95
See application file for complete search history.

(56) References Cited

U.S. PATENT DOCUMENTS 5,348,027 A   9/1994   Barnes et al.
5,388,594 A   2/1995   Counts et al.
(Continued)

FOREIGN PATENT DOCUMENTS

CA   2 778 903 A1   5/2011
CA   2 970 045 A1   6/2016
(Continued)

OTHER PUBLICATIONS

Communication dated Aug. 12, 2019 from the Korean Intellectual Property Office in Application No. 10-2019-0033722.
(Continued)

*Primary Examiner* — Hae Moon Hyeon
*Assistant Examiner* — Thang H Nguyen
(74) *Attorney, Agent, or Firm* — Sughrue Mion, PLLC

(57) ABSTRACT

Provided is a heater assembly for aerosol generating devices, the heater assembly including a thermally conductive element that has a cylindrical shape and includes an accommodation space for accommodating a cigarette, a flexible heater that surrounds at least a portion of an outer surface of the thermally conductive element, and an adhesion member that surrounds the flexible heater such that the flexible heater closely adheres to the thermally conductive element.

10 Claims, 5 Drawing Sheets

(51) Int. Cl.

| | | |
|---|---|---|
| *A24D 1/20* | (2020.01) | |
| *A24D 3/17* | (2020.01) | |
| *A24F 15/01* | (2020.01) | |
| *A24F 40/40* | (2020.01) | |
| *A24F 40/42* | (2020.01) | |
| *A24F 40/44* | (2020.01) | |
| *A24F 40/485* | (2020.01) | |
| *A24F 40/50* | (2020.01) | |
| *A24F 40/57* | (2020.01) | |
| *A24F 40/60* | (2020.01) | |
| *A24F 40/65* | (2020.01) | |
| *A24F 40/90* | (2020.01) | |
| *A24F 40/95* | (2020.01) | |
| *F21V 3/00* | (2015.01) | |
| *F21V 5/00* | (2018.01) | |
| *G02B 19/00* | (2006.01) | |
| *H05B 3/54* | (2006.01) | |
| *H05K 1/02* | (2006.01) | |
| *H05K 1/14* | (2006.01) | |
| *H05K 1/18* | (2006.01) | |
| *A24F 40/10* | (2020.01) | |
| *A24F 40/20* | (2020.01) | |
| *A24F 40/30* | (2020.01) | |
| *A24F 40/51* | (2020.01) | |
| *F21Y 115/10* | (2016.01) | |

(52) U.S. Cl.
CPC ............. *A24F 15/01* (2020.01); *A24F 40/40* (2020.01); *A24F 40/42* (2020.01); *A24F 40/44* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/10* (2020.01); *A24F 40/20* (2020.01); *A24F 40/30* (2020.01); *A24F 40/51* (2020.01); *F21Y 2115/10* (2016.08); *H05K 2201/012* (2013.01); *H05K 2201/0154* (2013.01); *H05K 2201/10219* (2013.01)

(56) References Cited

U.S. PATENT DOCUMENTS

| | | | |
|---|---|---|---|
| 5,408,574 A | | 4/1995 | Deevi et al. |
| 5,505,214 A | | 4/1996 | Collins et al. |
| 5,530,225 A | * | 6/1996 | Hajaligol ............... A24F 40/46 131/194 |
| 5,555,476 A | | 9/1996 | Suzuki et al. |
| 5,591,368 A | * | 1/1997 | Fleischhauer .......... A24F 40/46 131/194 |
| 5,665,262 A | * | 9/1997 | Hajaligol ............... A24F 40/46 131/194 |
| 5,692,525 A | | 12/1997 | Counts et al. |
| 5,723,228 A | | 3/1998 | Okamoto |
| 5,750,964 A | | 5/1998 | Counts et al. |
| 5,878,752 A | | 3/1999 | Adams et al. |
| 5,902,501 A | | 5/1999 | Nunnally et al. |
| 5,934,289 A | | 8/1999 | Watkins et al. |
| 5,949,346 A | | 9/1999 | Suzuki et al. |
| 5,970,719 A | | 10/1999 | Merritt |
| 6,026,820 A | | 2/2000 | Baggett, Jr. et al. |
| 6,615,840 B1 | | 9/2003 | Fournier et al. |
| 6,803,550 B2 | | 10/2004 | Sharpe et al. |
| 6,810,883 B2 | | 11/2004 | Felter et al. |
| 7,082,825 B2 | | 8/2006 | Aoshima et al. |
| 7,594,945 B2 | | 9/2009 | Kim et al. |
| 7,682,571 B2 | | 3/2010 | Kim et al. |
| 7,726,320 B2 | | 6/2010 | Robinson et al. |
| 8,205,622 B2 | | 6/2012 | Pan |
| 8,558,147 B2 | | 10/2013 | Greim et al. |
| 8,602,037 B2 | | 12/2013 | Inagaki |
| 8,689,804 B2 | | 4/2014 | Fernando et al. |
| 8,833,364 B2 | | 9/2014 | Buchberger |
| 8,997,754 B2 | | 4/2015 | Tucker et al. |
| 9,084,440 B2 | | 7/2015 | Zuber et al. |
| 9,165,484 B2 | | 10/2015 | Choi |
| 9,295,286 B2 | | 3/2016 | Shin |
| 9,347,644 B2 | | 5/2016 | Araki et al. |
| 9,405,148 B2 | | 8/2016 | Chang et al. |
| 9,420,829 B2 | | 8/2016 | Thorens et al. |
| 9,516,899 B2 | | 12/2016 | Plojoux et al. |
| 9,532,600 B2 | | 1/2017 | Thorens et al. |
| 9,541,820 B2 | | 1/2017 | Ogawa |
| 9,693,587 B2 | | 7/2017 | Plojoux et al. |
| 9,713,345 B2 | | 7/2017 | Farine et al. |
| 9,814,269 B2 | * | 11/2017 | Li ............... H05B 3/44 |
| 9,839,238 B2 | * | 12/2017 | Worm ............. A24F 40/40 |
| 9,844,234 B2 | | 12/2017 | Thorens et al. |
| 9,848,651 B2 | | 12/2017 | Wu |
| 9,854,845 B2 | | 1/2018 | Plojoux et al. |
| 9,888,727 B2 | | 2/2018 | Li et al. |
| 9,949,507 B2 | | 4/2018 | Flick |
| 9,974,117 B2 | | 5/2018 | Qiu |
| 10,070,667 B2 | | 9/2018 | Lord et al. |
| 10,104,909 B2 | | 10/2018 | Han et al. |
| 10,104,911 B2 | | 10/2018 | Thorens et al. |
| 10,136,673 B2 | | 11/2018 | Mironov |
| 10,136,675 B2 | | 11/2018 | Li et al. |
| 10,143,232 B2 | | 12/2018 | Talon |
| 10,238,149 B2 | | 3/2019 | Hon |
| 10,390,564 B2 | | 8/2019 | Fernando et al. |
| 10,412,994 B2 | * | 9/2019 | Schennum ............. A24F 40/95 |
| 10,426,193 B2 | | 10/2019 | Schennum et al. |
| 10,548,350 B2 | | 2/2020 | Greim et al. |
| 10,555,555 B2 | | 2/2020 | Fernando et al. |
| 10,602,778 B2 | | 3/2020 | Hu et al. |
| 10,617,149 B2 | | 4/2020 | Malgat et al. |
| 10,694,783 B2 | | 6/2020 | Jochnowitz |
| 10,701,973 B2 | | 7/2020 | Lee |
| 10,757,975 B2 | * | 9/2020 | Batista .............. A24F 40/46 |
| 10,842,194 B2 | | 11/2020 | Batista et al. |
| 10,973,087 B2 | | 4/2021 | Wang et al. |
| 11,051,545 B2 | | 7/2021 | Batista et al. |
| 11,051,550 B2 | | 7/2021 | Lin et al. |
| 11,147,316 B2 | * | 10/2021 | Farine ............... H05B 1/0244 |
| 2003/0226837 A1 | | 12/2003 | Blake et al. |
| 2004/0089314 A1 | | 5/2004 | Felter et al. |
| 2004/0149737 A1 | | 8/2004 | Sharpe et al. |
| 2005/0142036 A1 | | 6/2005 | Kim et al. |
| 2006/0267614 A1 | | 11/2006 | Lee et al. |
| 2007/0007266 A1 | | 1/2007 | Sasaki et al. |
| 2007/0074734 A1 | | 4/2007 | Braunshteyn et al. |
| 2007/0246382 A1 | | 10/2007 | He |
| 2007/0267031 A1 | | 11/2007 | Hon |
| 2010/0074616 A1 | | 3/2010 | Kewitsch |
| 2010/0313901 A1 | | 12/2010 | Fernando et al. |
| 2011/0155718 A1 | | 6/2011 | Greim et al. |
| 2011/0226236 A1 | | 9/2011 | Buchberger |
| 2011/0234069 A1 | | 9/2011 | Chen et al. |
| 2013/0014772 A1 | | 1/2013 | Liu |
| 2013/0220466 A1 | | 8/2013 | Zandiyeh et al. |
| 2013/0228191 A1 | | 9/2013 | Newton |
| 2013/0255675 A1 | | 10/2013 | Liu |
| 2013/0319999 A1 | | 12/2013 | Plojoux et al. |
| 2014/0060554 A1 | | 3/2014 | Collett et al. |
| 2014/0069424 A1 | | 3/2014 | Poston et al. |
| 2014/0209105 A1 | | 7/2014 | Sears et al. |
| 2014/0217085 A1 | | 8/2014 | Alima |
| 2014/0261487 A1 | | 9/2014 | Chapman et al. |
| 2014/0286630 A1 | | 9/2014 | Buchberger |
| 2014/0339509 A1 | | 11/2014 | Choi et al. |
| 2014/0345633 A1 | | 11/2014 | Talon et al. |
| 2014/0353856 A1 | | 12/2014 | Dubief |

(56) References Cited

U.S. PATENT DOCUMENTS

| | | |
|---|---|---|
| 2015/0020831 A1 | 1/2015 | Weigensberg et al. |
| 2015/0163859 A1 | 6/2015 | Schneider et al. |
| 2015/0223520 A1 | 8/2015 | Phillips et al. |
| 2015/0230521 A1 | 8/2015 | Talon |
| 2015/0282527 A1 | 10/2015 | Henry, Jr. |
| 2015/0327596 A1 | 11/2015 | Alarcon et al. |
| 2016/0044963 A1 | 2/2016 | Saleem |
| 2016/0103364 A1 | 4/2016 | Nam et al. |
| 2016/0128386 A1 | 5/2016 | Chen |
| 2016/0174613 A1 | 6/2016 | Zuber et al. |
| 2016/0205998 A1 | 7/2016 | Matsumoto et al. |
| 2016/0255879 A1 | 9/2016 | Paprocki et al. |
| 2016/0321879 A1 | 11/2016 | Oh et al. |
| 2016/0324216 A1 | 11/2016 | Li et al. |
| 2016/0331030 A1 | 11/2016 | Ampolini et al. |
| 2016/0338412 A1* | 11/2016 | Monsees ............ H05B 3/146 |
| 2016/0345625 A1 | 12/2016 | Liu |
| 2017/0020195 A1 | 1/2017 | Cameron |
| 2017/0042227 A1 | 2/2017 | Gavrielov et al. |
| 2017/0049155 A1 | 2/2017 | Liu |
| 2017/0055589 A1 | 3/2017 | Fernando et al. |
| 2017/0105454 A1 | 4/2017 | Li et al. |
| 2017/0119051 A1 | 5/2017 | Blandino et al. |
| 2017/0119053 A1 | 5/2017 | Henry, Jr. et al. |
| 2017/0143041 A1 | 5/2017 | Batista et al. |
| 2017/0188634 A1 | 7/2017 | Plojoux |
| 2017/0197043 A1 | 7/2017 | Buchberger |
| 2017/0197046 A1 | 7/2017 | Buchberger |
| 2017/0214261 A1 | 7/2017 | Gratton |
| 2017/0238609 A1 | 8/2017 | Schlipf |
| 2017/0295844 A1 | 10/2017 | Thevenaz et al. |
| 2017/0303598 A1 | 10/2017 | Li et al. |
| 2017/0325505 A1 | 11/2017 | Force et al. |
| 2017/0347715 A1 | 12/2017 | Mironov et al. |
| 2018/0027878 A1 | 2/2018 | Dendy et al. |
| 2018/0028993 A1 | 2/2018 | Dubief |
| 2018/0049471 A1 | 2/2018 | Holoubek et al. |
| 2018/0160733 A1 | 6/2018 | Leadley et al. |
| 2018/0199630 A1 | 7/2018 | Qiu |
| 2019/0059448 A1 | 2/2019 | Talon |
| 2019/0059524 A1 | 5/2019 | Qiu |
| 2019/0274354 A1* | 9/2019 | Sur ................... H05B 1/0244 |
| 2019/0281892 A1* | 9/2019 | Hejazi ................ H05B 6/108 |
| 2019/0281896 A1 | 9/2019 | Chapman et al. |
| 2020/0093177 A1 | 3/2020 | Han et al. |
| 2020/0093185 A1 | 3/2020 | Lim |
| 2020/0094997 A1 | 3/2020 | Menon et al. |
| 2020/0154765 A1 | 5/2020 | Lee et al. |
| 2020/0196670 A1 | 6/2020 | Alarcon et al. |
| 2020/0260790 A1 | 8/2020 | Kaufman et al. |
| 2020/0261000 A1 | 8/2020 | Kim et al. |
| 2020/0305240 A1 | 9/2020 | Holoubek et al. |
| 2020/0329772 A1 | 10/2020 | Kim et al. |
| 2020/0359681 A1 | 11/2020 | Han et al. |
| 2020/0404969 A1 | 12/2020 | Zuber et al. |
| 2021/0146067 A1 | 5/2021 | Buchberger |
| 2021/0235761 A1* | 8/2021 | Tsukamoto ........... H05B 3/04 |
| 2021/0337868 A1* | 11/2021 | Mazur ................ A24F 40/20 |
| 2022/0007723 A1* | 1/2022 | Desnerck ........... A24F 40/70 |

FOREIGN PATENT DOCUMENTS

| | | |
|---|---|---|
| CN | 1078621 A | 11/1993 |
| CN | 1126425 A | 7/1996 |
| CN | 1190335 A | 8/1998 |
| CN | 1280661 A | 1/2001 |
| CN | 1491598 A | 4/2004 |
| CN | 1633247 A | 6/2005 |
| CN | 1871987 A | 12/2006 |
| CN | 101277622 A | 10/2008 |
| CN | 101301963 A | 11/2008 |
| CN | 101324490 A | 12/2008 |
| CN | 201253138 Y | 6/2009 |
| CN | 101518361 A | 9/2009 |
| CN | 201314692 Y | 9/2009 |
| CN | 101557728 A | 10/2009 |
| CN | 101637308 A | 2/2010 |
| CN | 201657047 U | 11/2010 |
| CN | 201996322 U | 10/2011 |
| CN | 102264251 A | 11/2011 |
| CN | 102595943 A | 7/2012 |
| CN | 202385727 U | 8/2012 |
| CN | 102665459 A | 9/2012 |
| CN | 202854031 U | 4/2013 |
| CN | 103099319 A | 5/2013 |
| CN | 202907797 U | 5/2013 |
| CN | 203040065 U | 7/2013 |
| CN | 103271447 A | 9/2013 |
| CN | 103477252 A | 12/2013 |
| CN | 103519351 A | 1/2014 |
| CN | 103653257 A | 3/2014 |
| CN | 103653258 A | 3/2014 |
| CN | 203492793 U | 3/2014 |
| CN | 103720056 A | 4/2014 |
| CN | 103889258 A | 6/2014 |
| CN | 103974635 A | 8/2014 |
| CN | 103974638 A | 8/2014 |
| CN | 103974640 A | 8/2014 |
| CN | 103997922 A | 8/2014 |
| CN | 104146353 A | 11/2014 |
| CN | 104188110 A | 12/2014 |
| CN | 104219973 A | 12/2014 |
| CN | 204120226 U | 1/2015 |
| CN | 204132401 U | 2/2015 |
| CN | 204146340 U | 2/2015 |
| CN | 104423130 A | 3/2015 |
| CN | 204317492 U | 5/2015 |
| CN | 204393344 U | 6/2015 |
| CN | 204483007 U | 7/2015 |
| CN | 104886776 A | 9/2015 |
| CN | 105188430 A | 12/2015 |
| CN | 204838003 U | 12/2015 |
| CN | 105326092 A | 2/2016 |
| CN | 205072064 U | 3/2016 |
| CN | 205180371 U | 4/2016 |
| CN | 205214209 U | 5/2016 |
| CN | 105722416 A | 6/2016 |
| CN | 205358225 U | 7/2016 |
| CN | 105852221 A | 8/2016 |
| CN | 105852225 A | 8/2016 |
| CN | 205456064 U | 8/2016 |
| CN | 105919162 A | 9/2016 |
| CN | 205358219 U | 9/2016 |
| CN | 205624474 U | 10/2016 |
| CN | 106136331 A | 11/2016 |
| CN | 106163304 A | 11/2016 |
| CN | 106170215 A | 11/2016 |
| CN | 205671480 U | 11/2016 |
| CN | 106231934 A | 12/2016 |
| CN | 106235419 A | 12/2016 |
| CN | 205831079 U | 12/2016 |
| CN | 106418729 A | 2/2017 |
| CN | 106473232 A | 3/2017 |
| CN | 106473233 A | 3/2017 |
| CN | 106490686 A | 3/2017 |
| CN | 106535680 A | 3/2017 |
| CN | 106690427 A | 5/2017 |
| CN | 106723379 A | 5/2017 |
| CN | 106793834 A | 5/2017 |
| CN | 206197012 U | 5/2017 |
| CN | 106912985 A | 7/2017 |
| CN | 206314585 U | 7/2017 |
| CN | 106998816 A | 8/2017 |
| CN | 107105772 A | 8/2017 |
| CN | 206442590 U | 8/2017 |
| CN | 206443202 U | 8/2017 |
| CN | 206443214 U | 8/2017 |
| CN | 107173850 A | 9/2017 |
| CN | 107183789 A | 9/2017 |
| CN | 107205491 A | 9/2017 |
| CN | 206462413 U | 9/2017 |
| CN | 107249366 A | 10/2017 |
| CN | 107278125 A | 10/2017 |
| CN | 206547882 U | 10/2017 |

(56) References Cited

FOREIGN PATENT DOCUMENTS

| | | |
|---|---|---|
| CN | 107801375 A | 3/2018 |
| CN | 108013512 A | 5/2018 |
| CN | 110325058 A | 10/2019 |
| CN | 110958841 A | 4/2020 |
| EA | 1 947 965 A2 | 7/2008 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 0 822 760 B1 | 6/2003 |
| EP | 2 201 850 A1 | 6/2010 |
| EP | 2 316 286 A1 | 5/2011 |
| EP | 2 327 318 A1 | 6/2011 |
| EP | 2 340 729 A1 | 7/2011 |
| EP | 2 368 449 A1 | 9/2011 |
| EP | 2 677 273 A1 | 12/2013 |
| EP | 2 921 065 A1 | 9/2015 |
| EP | 3104721 A1 | 12/2016 |
| EP | 3 257 386 B1 | 6/2019 |
| EP | 3 248 486 B1 | 8/2019 |
| EP | 3 569 076 A1 | 11/2019 |
| EP | 3 248 485 B1 | 4/2020 |
| EP | 3 656 229 A2 | 5/2020 |
| GB | 2 301 894 A | 12/1996 |
| GB | 2514893 A | 12/2014 |
| JP | 48-63677 U | 8/1973 |
| JP | 62-15793 A | 1/1987 |
| JP | 63-68690 U | 5/1988 |
| JP | 6-73784 U | 10/1994 |
| JP | 7-72809 A | 3/1995 |
| JP | 7-184627 A | 7/1995 |
| JP | 8-122942 A | 5/1996 |
| JP | 9-075058 A | 3/1997 |
| JP | 9-161822 A | 6/1997 |
| JP | 9-228919 A | 9/1997 |
| JP | 10-37781 A | 2/1998 |
| JP | 2001-200495 A | 7/2001 |
| JP | 2002-514910 A | 5/2002 |
| JP | 2003-527127 A | 9/2003 |
| JP | 2004-212102 A | 7/2004 |
| JP | 2005-199913 A | 7/2005 |
| JP | 2006-252897 A | 7/2006 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2012-513750 A | 6/2012 |
| JP | 2013-509160 A | 3/2013 |
| JP | 2013-524835 A | 6/2013 |
| JP | 2014-132560 A | 7/2014 |
| JP | 2014-216287 A | 11/2014 |
| JP | 2014-533513 A | 12/2014 |
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-127300 A | 7/2017 |
| JP | 2017-522876 A | 8/2017 |
| KR | 10-1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2015-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0044165 A | 4/2014 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-2016-0064159 A | 6/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-2017-0057535 A | 5/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A | 10/2017 |
| KR | 10-2018-0003648 A | 1/2018 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/102092 A1 | 7/2014 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/117702 A1 | 8/2015 |
| WO | 2015/150759 A1 | 10/2015 |
| WO | 2015/168828 A1 | 11/2015 |
| WO | 2015/174657 A1 | 11/2015 |
| WO | 2015/177046 A1 | 11/2015 |
| WO | 2015/189388 A1 | 12/2015 |

(56) References Cited

FOREIGN PATENT DOCUMENTS

| WO | 2016/005601 A1 | 1/2016 |
|---|---|---|
| WO | 2016/009202 A1 | 1/2016 |
| WO | 2016/012795 A1 | 1/2016 |
| WO | 2016/091658 A1 | 6/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/184978 A1 | 11/2016 |
| WO | 2016/199065 A1 | 12/2016 |
| WO | 2016/199066 A1 | 12/2016 |
| WO | 2016/207407 A1 | 12/2016 |
| WO | 2017/001520 A1 | 1/2017 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Communication dated Feb. 24, 2021 by the Japanese Patent Office in application No. 2020-503962.
Communication dated Jul. 27, 2020 by the Russian Patent Office in application No. 2020110821.
Extended European Search Report dated Jan. 15, 2021 in European Application No. 18799246.6.
Office Action dated Aug. 26, 2022, issued in Chinese Application No. 201880048703.8.
Office Action dated Dec. 29, 2022 from the China National Intellectual Property Administration in CN Application No. 201880055847.6.
Office Action dated Feb. 14, 2023 from the Japanese Patent Office in JP Application No. 2022-074915.
Office Action dated Jan. 20, 2023 from the China National Intellectual Property Administration in CN Application No. 202010761215.0.
Office Action dated Jan. 28, 2023 from the China National Intellectual Property Administration in CN Application No. 202010761219.9.
Office Action dated Jul. 12, 2022, issued in Chinese Application No. 201880049189.X.
Office Action dated Jul. 4, 2022, issued in Chinese Application No. 201880048657.1.
Office Action dated Jun. 22, 2022, issued in Chinese Application No. 201880048444.9.
Office Action dated Jun. 28, 2022, issued in Japanese Application No. 2020-522897.
Office Action dated Mar. 30, 2023 from the Chinese Patent Office in Application No. 201880030661.5.
Office Action dated Nov. 1, 2022 from Japanese Patent Office in JP Application No. 2020-501205.
Office Action dated Dec. 20, 2022 from the Japanese Patent Office in JP Application No. 2021-122551.
Office Action dated Jan. 10, 2023 from the Japanese Patent Office in JP Application No. 2021-080578.
Su Zuen et al., "Heat Transfer", Dalian Maritime University Press, Feb. 28, 1989, pp. 12-13 (9 pages total).
Office Action issued in parent U.S. Appl. No. 16/759,439 dated Apr. 12, 2022.
Office Action issued in parent U.S. Appl. No. 16/759,439 dated Sep. 23, 2022.
Notice of Allowance issued in parent U.S. Appl. No. 16/759,439 dated Jan. 26, 2023.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.
Office Action dated Oct. 8, 2019 in Korean Application No. 10-2018-0072935.
Office Action dated Sep. 6, 2019 in Korean Application No. 10-2018-0069645.
Office Action dated Jul. 10, 2019 in Korean Application No. 10-2018-0064487.
Office Action dated Jun. 24, 2019 in Korean Application No. 10-2018-0062137.
Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.
International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR2018/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.
International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Communication dated Jun. 11, 2020 by the Korean Patent Office in Application No. 10-2018-0051469.
Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.

(56) References Cited

OTHER PUBLICATIONS

Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.
Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Communication dated Mar. 23, 2021 by the Japanese Patent Office in application No. 2020-522897.
Communication dated Mar. 2, 2021 by the Japanese Patent Office in application No. 2020-523669.
Communication dated Mar. 30, 2021 by the Japanese Patent Office in application No. 2020-501446.
Communication dated Mar. 16, 2021 by the Japanese Patent Office in application No. 2020-521441.
Communication dated Feb. 9, 2021 by the Japanese Patent Office in application No. 2020-501205.
Communication dated Mar. 16, 2021 by the European Patent Office in application No. 18806877.9.
Office Action dated Apr. 5, 2019 in Korean Application No. 10-2019-0017393.
Office Action dated Apr. 25, 2019 in Korean Application No. 10-2019-0033722.
Office Action dated Apr. 25, 2019 in Korean Application No. 10-2019-0033723.
Office Action dated Jun. 7, 2021 in Canadian Application No. 3,076,886.
Office Action dated Feb. 9, 2018 in Korean Application No. 10-2017-0058786.
Extended European Search Report dated Sep. 9, 2021 in European Application No. 18873562.5.
Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.
Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Extended European Search Report dated Oct. 15, 2021 in European Application No. 18872138.5.
Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.
Office Action dated Jan. 24, 2022 in Chinese Application No. 201880030661.5.
Office Action dated Dec. 24, 2021 in Chinese Application No. 201880055847.6.
Office Action dated Dec. 20, 2021 in Chinese Application No. 201880048655.2.
Office Action dated Jan. 4, 2022 in Chinese Application No. 201880048703.8.
Office Action dated Jan. 18, 2022 in Chinese Application No. 201880052857.4.
Office Action dated Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action dated Dec. 31, 2021 in Chinese Application No. 201880049189.X.
Communication dated Feb. 28, 2022 from the Chinese Patent Office in Chinese Application No. 201880063459.2.
Communication dated Mar. 29, 2022 from the Japanese Patent Office in Japanese Application No. 2020-522897.
Communication dated Mar. 3, 2022 from the Chinese Patent Office in Chinese Application No. 201880058682.8.
Wenxue Geng et al., "Technology Manual of a Programmable Controller", Science Technology, 1st Edition, 1996, p. 132 (2 pages total).
Office Action dated May 12, 2023 in Chinese Application No. 201880048703.8.
Wei-Ping Jia et al., "Determination of Aerosol Concentration in Mainstream Cigarette Smoke Based on Online Impact", Tobacco Science & Technology, Manufacturing Technology, Dec. 2010, vol. 281 (4 pages total).
Extended European Search Report dated Dec. 12, 2023 in Application No. 23210344.0.
Chinese Office Action dated Feb. 23, 2024 in Application No. 202010761215.0.

* cited by examiner

AEROSOL GENERATING DEVICE AND HEATER ASSEMBLY FOR AEROSOL GENERATING DEVICE

CROSS-REFERENCE TO RELATED APPLICATIONS

This is a continuation of U.S. application Ser. No. 16/759,439 filed on Apr. 27, 2020, which is a national stage of International Application No. PCT/KR2018/012809 filed on Oct. 26, 2018, which is based on and claims priority under 35 U.S.C. § 119 to Korean Application No. 10-2017-0142578, filed on Oct. 30, 2017 and Korean Application No. 10-2018-0055120, filed on May 14, 2018 in the Korean Intellectual Property Office, the disclosures of which are incorporated herein by reference in their entireties.

TECHNICAL FIELD

The present disclosure relates to an aerosol generating device and a heater assembly for aerosol generating devices, and more particularly, to an aerosol generating device capable of generating aerosol having a rich flavor by allowing aerosol generated by a vaporizer to pass through a cigarette, and a heater assembly for aerosol generating devices.

BACKGROUND ART

Recently, there has been an increasing demand for an alternative method of overcoming the disadvantages of regular cigarettes. For example, instead of a method of generating aerosol by burning a cigarette, a method of generating aerosol by heating an aerosol generating material of a cigarette has been increasingly demanded. Accordingly, there has been active research into a heating-type cigarette and a heating-type aerosol generation device.

Conventional heating-type aerosol generating devices include a heater that is inserted into a cigarette in order to heat an aerosol generating material of the cigarette. However, when the heater is inserted into the cigarette, at least a portion of the outer surface of the cigarette is penetrated, and thus, materials of the cigarette leak to the outside of the cigarette.

To address this problem, an external heater configured to heat the outside of a cigarette without being inserted into the cigarette has been developed. However, compared with a heater directly heating an aerosol generating material of a cigarette by being inserted into the cigarette, when an external heater is used, heat transference may be reduced. Thus, technology regarding a structure of an external heater and a heat-insulation structure for preventing reduction of heat transference or reducing heat loss is in demand.

DESCRIPTION OF EXEMPLARY EMBODIMENTS

Solution to Problem

Provided are an aerosol generating device and a heater assembly for aerosol generating devices. Technical objectives of exemplary embodiments are not limited to the described technical objectives, and other technical objectives may be derived from the embodiments to be described hereinafter. For example, an aerosol generating device may include a thermally conductive element having a cylindrical shape and including an accommodation space that accommodates a cigarette; a flexible heater that surrounds at least a portion of an outer surface of the thermally conductive element; an adhesion member that surrounds an outer surface of the flexible heater to allow the flexible heater to closely adhere to the thermally conductive element; and a battery configured to supply power to the flexible heater.

Advantageous Effects of Disclosure

Provided are an aerosol generating device and a heater assembly for aerosol generating devices. In detail, an aerosol generating device according to the present disclosure may include a heater assembly for aerosol generating devices, the heater assembly including a thermally conductive element having a cylindrical shape and including an accommodation space that accommodates a cigarette, a flexible heater that surrounds at least a portion of an outer surface of the thermally conductive element, and an adhesion member that surrounds the flexible heater to allow the flexible heater to closely adhere to the thermally conductive element. Heat generated as the flexible heater operates with power supply from the battery may be delivered to a cigarette through the thermally conductive element. In this case, because the adhesion member allows the flexible heater to closely adhere to the thermally conductive element, heat loss while the heat generated by the flexible heater is being delivered to the thermally conductive element may be minimized.

At least one air gap and at least one internal housing are provided between an external housing defining the exterior of the aerosol generating device and the flexible heater, and a heat-insulation material is applied to at least one of the respective inner and outer surfaces of the external housing and the internal housing. Therefore, the heat generated by the flexible heater may be effectively prevented from being lost to the outside of the aerosol generating device.

BEST MODE

Figure 1:
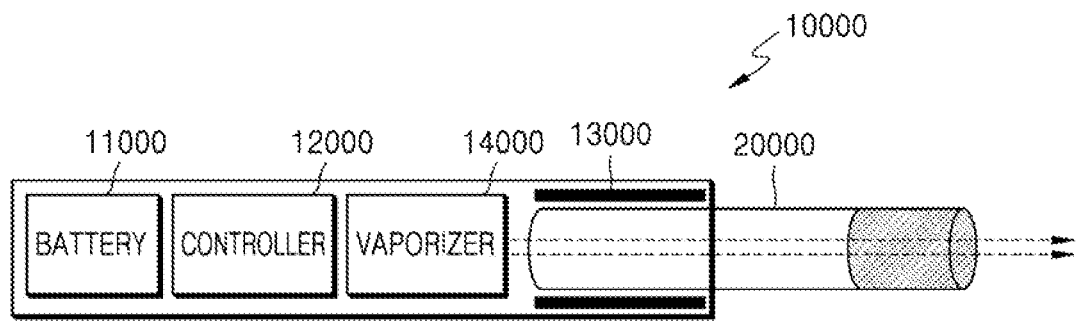
FIGS. 1 and 2 are diagrams showing examples in which a cigarette is inserted into an aerosol generating device.

According to an exemplary embodiment, an aerosol generating device includes a thermally conductive element that has a cylindrical shape and includes an accommodation space for accommodating a cigarette; a flexible heater that surrounds at least a portion of an outer surface of the thermally conductive element; an adhesion member that surrounds an outer surface of the flexible heater such that the flexible heater closely adheres to the thermally conductive element; and a battery configured to supply power to the flexible heater.

The adhesion member may have elastic force directed inward or has a property of shrinking as a temperature increases.

For example, the adhesion member may include at least one material of a heat-resistant synthetic resin, polytetrafluoroethylene (Teflon), and silicon.

The thermally conductive element may include copper, nickel, iron, chromium, or an alloy made from copper, nickel, iron, or chromium.

The flexible heater may include a heat-resistant resin film and an electrically conductive track.

According to an exemplary embodiment, the aerosol generating device may further include an external housing that forms the exterior of the aerosol generating device; and at least one air gap and at least one internal housing which are disposed between the external housing and the flexible heater.

The external housing and the internal housing may include a heat-resisting material.

The heat-resisting material may include a material capable of withstanding heat of 80° C. or higher.

The heat-resisting material may include a heat-resistant polymer having a melting point or a glass transition temperature that is 80° C. or higher.

The aerosol generating device may further include a heat-insulation part on at least one of inner and outer surfaces of the external housing and the internal housing.

The heat-insulation part may include at least one of a porous material, graphite, and ceramic.

According to another aspect of the present disclosure, a heat assembly for aerosol generating devices includes a thermally conductive element that has a cylindrical shape and includes an accommodation space for accommodating a cigarette; a flexible heater that surrounds at least a portion of an outer surface of the thermally conductive element; and an adhesion member that surrounds the flexible heater such that the flexible heater closely adheres to the thermally conductive element.

Mode of Disclosure

With respect to the terms in the various exemplary embodiments, the general terms which are currently and widely used are selected in consideration of functions of structural elements in the various exemplary embodiments of the present disclosure. However, meanings of the terms can be changed according to intention, a judicial precedence, the appearance of a new technology, and the like. In addition, in certain cases, a term which is not commonly used can be selected. In such a case, the meaning of the term will be described in detail at the corresponding portion in the description of the present disclosure. Therefore, the terms used in the various exemplary embodiments of the present disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

Hereinafter, the present disclosure will now be described more fully with reference to the accompanying drawings, in which exemplary embodiments of the present disclosure are shown such that one of ordinary skill in the art may easily work the present disclosure. The disclosure can, however, be embodied in many different forms and should not be construed as being limited to the exemplary embodiments set forth herein.

Hereinafter, exemplary embodiments of the present disclosure will be described in detail with reference to the drawings.

Figure 2:
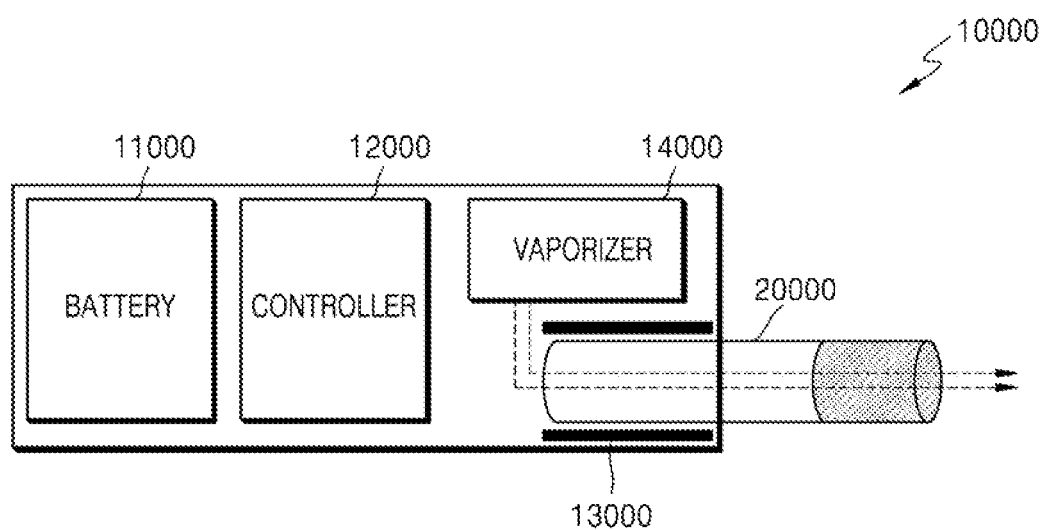

FIGS. 1 and 2 are diagrams showing examples in which a cigarette is inserted into an aerosol generating device.

Referring to FIGS. 1 and 2, an aerosol generating device 10000 includes a battery 11000, a controller 12000, a heater assembly 13000, and a vaporizer 14000. Also, a cigarette 20000 may be inserted into an inner space of the aerosol generating device 10000.

FIGS. 1 and 2 only illustrate components of the aerosol generating device 10000, which are related to the present embodiment. Therefore, it will be understood by one of ordinary skill in the art that other general-purpose components may be further included in the aerosol generating device 10000, in addition to the components illustrated in FIG. 1.

Also, FIGS. 1 and 2 illustrate that the aerosol generating device 10000 includes the heater assembly 13000. However, as necessary, the heater assembly 13000 may be omitted.

FIG. 1 illustrates that the battery 11000, the controller 12000, the vaporizer 14000, and the heater assembly 13000 are arranged in series. On the other hand, FIG. 2 illustrates that the vaporizer 14000 and the heater assembly 13000 are arranged in parallel. However, the internal structure of the aerosol generating device 10000 is not limited to the structures illustrated in FIG. 1 or FIG. 2. In other words, according to the design of the aerosol generating device 10000, the battery 11000, the controller 12000, the vaporizer 14000, and the heater assembly 13000 may be differently arranged.

When the cigarette 20000 is inserted into the aerosol generating device 10000, the aerosol generating device 10000 may operate the vaporizer 14000 to generate aerosol. The aerosol generated by the vaporizer 14000 is delivered to the user by passing through the cigarette 20000. The vaporizer 14000 will be described in more detail later.

The battery 11000 may supply power to be used for the aerosol generating device 10000 to operate. For example, the battery 11000 may supply power to heat the heater assembly 13000 or the vaporizer 14000 and may supply power for operating the controller 12000. Also, the battery 11000 may supply power for operations of a display, a sensor, a motor, etc. mounted in the aerosol generating device 10000.

The controller 12000 may generally control operations of the aerosol generating device 10000. In detail, the controller 12000 may control not only operations of the battery 11000, the heater assembly 13000, and the vaporizer 14000, but also operations of other components included in the aerosol generating device 10000. Also, the controller 12000 may check a state of each of the components of the aerosol generating device 10000 to determine whether or not the aerosol generating device 10000 is in an operable state.

The controller 12000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater assembly 13000 may be heated by the power supplied from the battery 11000. For example, when the cigarette 20000 is inserted into the aerosol generating device 10000, the heater assembly 13000 may be located outside the cigarette 20000 and may increase a temperature of an aerosol generating material in the cigarette 20000.

The heater assembly 13000 may include an electro-resistive heater. For example, the heater assembly 13000 may include an electrically conductive track, and the heater assembly 13000 may be heated when currents flow through the electrically conductive track. However, the heater assembly 13000 is not limited to the example described above and may include any other heaters which may be heated to a desired temperature. Here, the desired temperature may be pre-set in the aerosol generating device 10000 or may be set by a user.

Also, the aerosol generating device 10000 may include a plurality of heaters 13000. Here, the plurality of heaters 13000 may be arranged outside the cigarette 20000. In addition, the shape of the heater assembly 13000 is not limited to the shapes illustrated in FIGS. 1 and 2 and may include various shapes.

The vaporizer 14000 may generate aerosol by heating a liquid composition, and the generated aerosol may pass through the cigarette 20000 to be delivered to a user. In other words, the aerosol generated by the vaporizer 14000 may move along an air flow passage of the aerosol generating device 10000. The air flow passage may be configured such that the aerosol generated by the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generating device 10000 as independent modules.

The liquid storage may store a liquid composition. For example, the liquid composition may be a liquid including a tobacco-containing material having a volatile tobacco flavor component, or a liquid including a non-tobacco material. The liquid storage may be attachable to and detachable from the vaporizer 14000. Alternatively, the liquid storage may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be wound around the liquid delivery element. The heating element may be heated by electrical current and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generating device 10000 may further include general-purpose components in addition to the battery 11000, the controller 12000, and the heater assembly 13000. For example, the aerosol generating device 10000 may include a display capable of outputting visual information and/or a motor for outputting haptic information. Also, the aerosol generating device 10000 may include at least one sensor (a puff detecting sensor, a temperature detecting sensor, a cigarette insertion detecting sensor, etc.). Also, the aerosol generating device 10000 may be formed as a structure where, even when the cigarette 20000 is inserted into the aerosol generating device 10000, external air may be introduced or internal air may be discharged.

Although not illustrated in FIGS. 1 and 2, a cradle may be used with the aerosol generating device 10000 as a system. For example, the cradle may be used to charge the battery 11000 of the aerosol generating device 10000. Alternatively, the heater assembly 13000 may be heated when the cradle and the aerosol generating device 10000 are coupled to each other.

The cigarette 20000 may be similar to a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generating device 10000, and the second portion may be exposed to the outside. Alternatively, the first portion may be partially inserted into the aerosol generating device 10000. Otherwise, the first portion and a part of the second portion may be inserted into the aerosol generating device 10000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 10000. For example, opening and closing of the air passage and/or a size of the air passage may be adjusted by the user. Accordingly, the amount of smoke and a smoking impression may be adjusted by the user. As another example, the external air may flow into the cigarette 20000 through at least one hole formed in a surface of the cigarette 20000.

Hereinafter, an example of the cigarette 20000 will be described with reference to FIG. 3.

Figure 3:
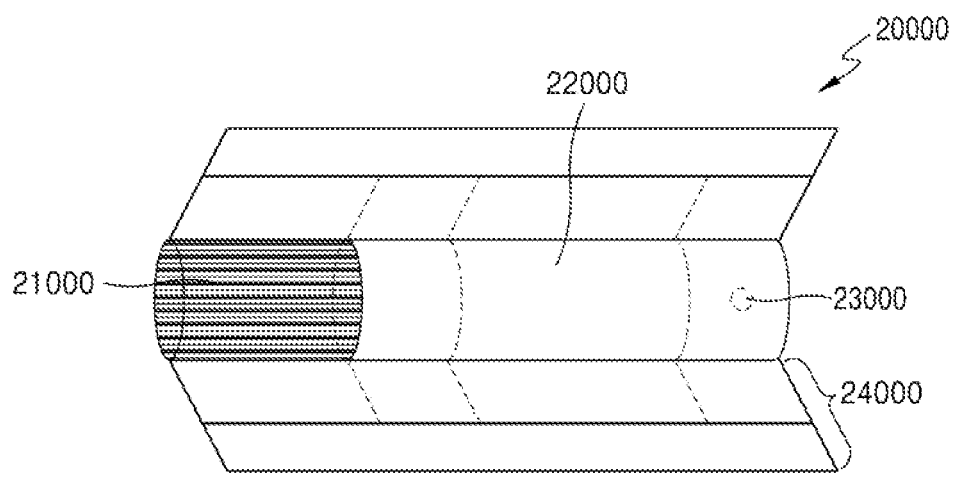
FIG. 3 is a drawing illustrating an example of a cigarette.

FIG. 3 is a drawing illustrating an example of a cigarette.

Referring to FIG. 3, the cigarette 20000 may include a tobacco rod 21000 and a filter rod 22000. The first portion described above with reference to FIGS. 1 and 2 may include the tobacco rod 21000, and the second portion may include the filter rod 22000.

FIG. 3 illustrates that the filter rod 22000 includes a single segment. However, the filter rod 22000 is not limited thereto. In other words, the filter rod 22000 may include a plurality of segments. For example, the filter rod 22000 may include a first segment configured to cool aerosol and a second segment configured to filter a certain component included in the aerosol. Also, as necessary, the filter rod 22000 may further include at least one segment configured to perform other functions.

The cigarette 20000 may be packaged using at least one wrapper 24000. The wrapper 24000 may have at least one hole through which external air may be introduced or internal air may be discharged. For example, the cigarette 20000 may be packaged using one wrapper 24000. As another example, the cigarette 20000 may be doubly packaged using at least two wrappers 24000. For example, the tobacco rod 21000 may be packaged using a first wrapper, and the filter rod 22000 may be packaged using a second wrapper. Also, the tobacco rod 21000 and the filter rod 22000, which are respectively packaged using separate wrappers, may be combined and packaged together using a third wrapper. When each of the tobacco rod 21000 and the filter rod 22000 includes a plurality of segments, each segment may be packaged using a separate wrapper. Also, the entire cigarette 20000 including the plurality of segments, which are respectively packaged using the separate wrappers and coupled to each other, may be re-packaged using another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed of tiny bits cut from a tobacco sheet. Also, the tobacco rod 21000 may be surrounded by a thermally conductive material. For example, the thermally conductive material may be, but is not limited to, a metal foil such as aluminum foil. For example, the thermally conductive material surrounding the tobacco rod 21000 may uniformly distribute heat transmitted to the tobacco rod 21000, and thus, the heat conductivity applied to the tobacco rod may be increased and taste of the tobacco may be improved.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected onto the filter rod 22000, or an additional fiber coated with a flavoring liquid may be inserted into the filter rod 22000.

Also, the filter rod 22000 may include at least one capsule 23000. Here, the capsule 23000 may generate a flavor or aerosol. For example, the capsule 23000 may have a configuration in which a liquid containing a flavoring material is wrapped with a film. For example, the capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material for forming the cooling segment is not limited thereto. In an exemplary embodiment, the cooling segment may include a cellulose acetate filter having a plurality of holes. However, the cooling segment is not limited to the above-described example and any other cooling segment that is capable of cooling the aerosol may be used.

Although not illustrated in FIG. 3, the cigarette 20000 according to an exemplary embodiment may further include a front-end filter. The front-end filter may be located on a side of the tobacco rod 21000, which is away from the filter rod 22000. The front-end filter may prevent the tobacco rod 21000 from being detached and prevent the liquefied aerosol from flowing into the aerosol generating device 10000 (FIGS. 1 and 2) from the tobacco rod 21000, during smoking.

Figure 4:
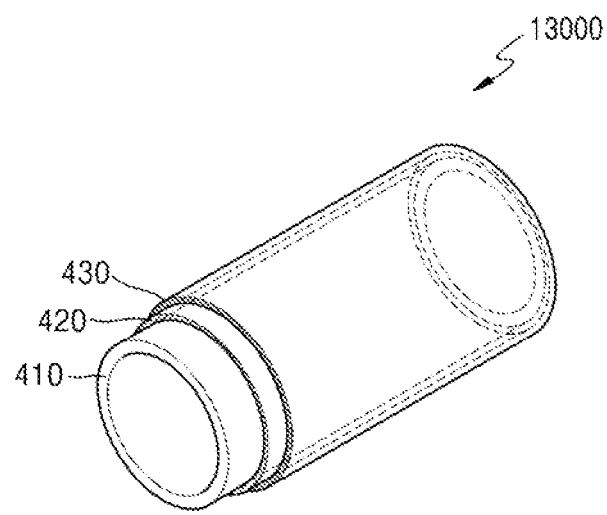
FIG. 4 illustrates a structure of a heater assembly for aerosol generating devices, according to an exemplary embodiment.

FIG. 4 illustrates a structure of a heater assembly for aerosol generating devices, according to an exemplary embodiment.

Referring to FIG. 4, a heater assembly 13000 for aerosol generating devices may include a thermally conductive element 410, a flexible heater 420, and an adhesion member 430. FIG. 4 only shows components related with the present embodiment from among the components of the heater assembly 13000 for aerosol generating devices. Accordingly, it will be understood by one of ordinary skill in the art that general-use components other than the components illustrated in FIG. 4 may be further included in the heater assembly 13000 for aerosol generating devices. For example, the heater assembly 13000 may further include at least one electrical connector for electrical connection between the flexible heater 420 and the battery 11000.

The thermally conductive element 410 may refer to a metal structure having an accommodation space for receiving the cigarette 20000 is formed. The thermally conductive element 410 may include a hollow that is an accommodation space for receiving the cigarette 20000. As shown in FIG. 4, the hollow included in the thermally conductive element 410 may have a circular cross-section to correspond to the shape of the cigarette 20000, and the thermally conductive element 410 may be cylindrical. However, the cross-section of the hollow included in the thermally conductive element 410 may be a polygon, and may have various sizes and shapes according to the shape of the cigarette 20000.

The thermally conductive element 410 may include a metal material having high heat conductivity. The thermally conductive element 410 may include a rigid material to accommodate the cigarette 20000 therein. For example, the thermally conductive element 410 may include copper, nickel, iron, chromium, or an alloy thereof. However, embodiments of the present disclosure are not limited thereto, and the thermally conductive element 410 may include an arbitrary suitable metal material that has high thermal transfer power and is rigid.

The flexible heater 420 may be a heater having a shape that surrounds at least a portion of the outer surface of the thermally conductive element 410. The flexible heater 420 may include a heat-resistant resin film and an electrically conductive track. The heat-resistant resin film may include one or more of polyethylene, polypropylene, polyethylene terephthalate, polycyclohexylenedimethylene terephthalate, and polyimide.

For example, the flexible heater 420 may have a structure in which a patterned electrically conductive track is laminated on a heat-resistant resin film. The flexible heater 420 may be cylindrical and may have a cylindrical shape into which a flexible flat material is rolled. However, embodiments are not limited thereto. The flexible heater 420 may be heated due to power supply from the battery 11000.

The adhesion member 430 may mean a member that surrounds an outer surface of the flexible heater 420 in order to allow the flexible heater 420 to closely adhere to the thermally conductive element 410. The flexible heater 420 closely adhering to the thermally conductive element 410 may mean that a gap between the flexible heater 420 and the thermally conductive element 410 is minimized. As the flexible heater 420 closely adheres to the thermally conductive element 410 by the adhesion member 430, heat loss while heat generated by the flexible heater 420 is being delivered to the thermally conductive element 410 may be minimized.

The adhesion member 430 may have an elastic force in a direction toward an inner surface of the adhesion member 430, or may have a property that it shrinks with an increase in the temperature. Because the adhesion member 430 has an elastic force in a direction toward an inner surface of the adhesion member 430 or has a property that it shrinks with an increase in the temperature, the flexible heater 420 surrounded by the adhesion member 430 may closely adhere to the thermally conductive element 410. For example, the adhesion member 430 may include, but is not limited to, at least one material of a heat-resistant synthetic resin, polytetrafluoroethylene (Teflon), and silicon. The adhesion member 430 may include an arbitrary suitable material having elastic force directed inward or having a property of shrinking as a temperature increases.

The adhesion member 430 may include a heat-resisting material to endure the heat generated by the flexible heater 420 and may include a heat-insulation material to prevent the heat generated by the flexible heater from being lost to the outside. The adhesion member 430 may include an arbitrary suitable material that enables the flexible heater 420 to closely adhere to the thermally conductive element 410.

Although respective lengths of the thermally conductive element 410, the flexible heater 420, and the adhesion member 430 are illustrated as decreasing in order of their arrangement in FIG. 4, this is merely for easy understanding of the structure of the heater assembly 13000 for aerosol generating devices. Each of the thermally conductive element 410, the flexible heater 420, and the adhesion member 430 may have an arbitrary suitable length. A heat-insulation structure of the aerosol generating device 10000 including the heater assembly 13000 for aerosol generating devices will now be described in detail with reference to FIG. 5.

Figure 5:
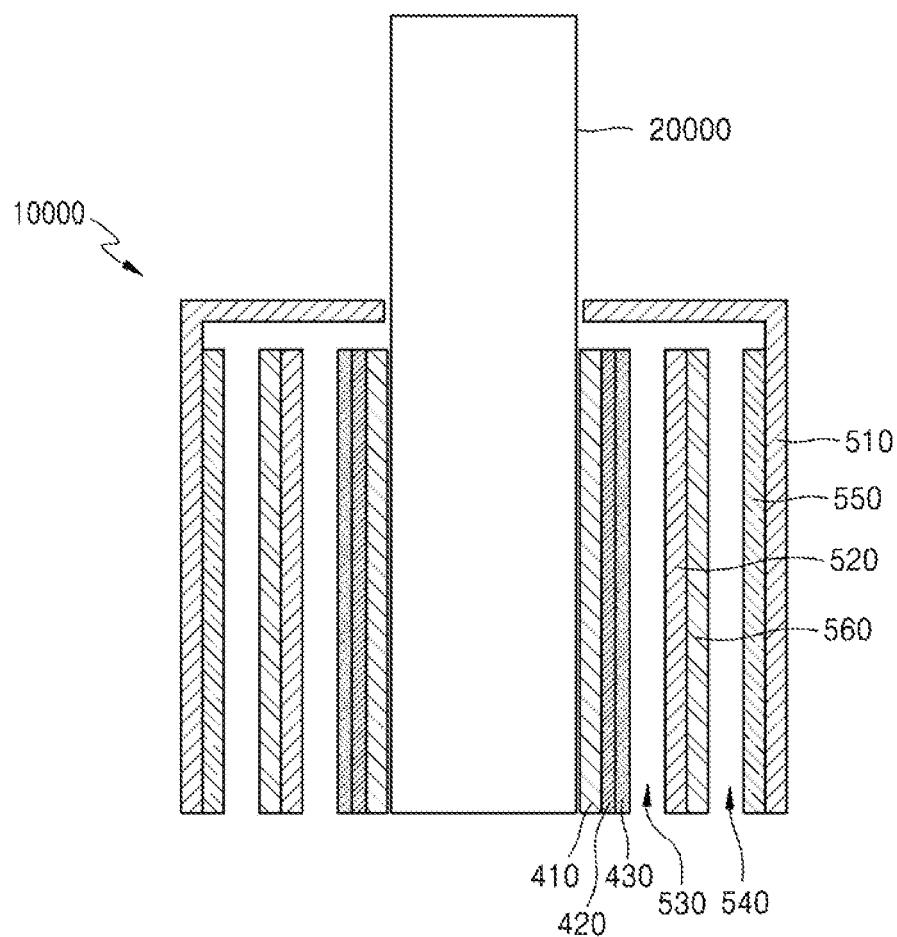
FIG. 5 illustrates a structure of an aerosol generating devices according to an exemplary embodiment.

FIG. 5 illustrates a structure of an aerosol generating device according to an exemplary embodiment.

Referring to FIG. 5, the aerosol generating device 10000 may further include an external housing 510, an internal housing 520, a first air gap 530, a second air gap 540, a first heat-insulation part 550, and a second heat-insulation part 560 in addition to the thermally conductive element 410, the flexible heater 420, and the adhesion member 430. Since the thermally conductive element 410, the flexible heater 420, and the adhesion member 430 are the same as the components of FIG. 4, repeated descriptions thereof are omitted herein. Only components related with the present embodiment from among the components of the aerosol generating device 10000 are shown in FIG. 5. Accordingly, it will be understood by one of ordinary skill in the art related with the present embodiment that general-use components other than the components illustrated in FIG. 5 may be further included in the aerosol generating device 10000.

The external housing 510 may refer to a case that forms the exterior of the aerosol generating device 10000. The external housing 510 may include a heat-resisting material, and the heat-resisting material may include a material capable of withstanding heat of 130° C. or higher. Withstanding heat of 130° C. or higher means that a melting point (Tm) of a heat-resisting material is 130° C. or higher.

The heat-resisting material may be heat-resistant synthetic resin. When the heat-resisting material is heat-resistant synthetic resin, at least one of the melting point of the heat-resisting material and a glass transition temperature (Tg) thereof may be 130° C. or higher.

For example, the heat-resisting material may include at least one of, for example, polypropylene, polyether ether ketone (PEEK), polyethylene, polypropylene, polyethylene terephthalate, polycyclohexylenedimethylene terephthalate, polyimide, sulfone-based resin, fluorine-based resin, and aramid. The sulfone-based resin may include a resin such as polyethylsulfone or polyphenylene sulfide, and the fluorine resin may include polytetrafluoroethylene (Teflon).

However, the heat-resisting material is not limited thereto. For example, the heat-resisting material may be an arbitrary suitable material capable of withstanding heat of 80° C. or higher, or the heat-resisting material may be an arbitrary suitable material capable of withstanding heat of 100° C. or higher. For example, the heat-resisting material may be an arbitrary suitable material capable of withstanding heat of 150° C. or higher. For example, the heat-resisting material may be an arbitrary suitable material capable of withstanding heat of 200° C. or higher. For example, the heat-resisting material may be an arbitrary suitable material capable of withstanding heat of 300° C. or higher. For example, the heat-resisting material may be an arbitrary suitable material capable of withstanding heat of 400° C. or higher.

At least one air gap and at least one internal housing may be located between the external housing 510 and the flexible heater 420. For example, the aerosol generating device 10000 may further include the internal housing 520, the first air gap 530, and the second air gap 540 that are located between the external housing 510 and the flexible heater 420. Although a single internal housing and two air gaps are shown in FIG. 5, the number of air gaps and the number of internal housings may be arbitrary suitable numbers.

The internal housing 520 may form the internal structure of the aerosol generating device 10000. The internal housing 520 may include a heat-resisting material, which may include a material capable of withstanding heat of 130° C. or higher.

The heat-resisting material may be heat-resistant synthetic resin. When the heat-resisting material is heat-resistant synthetic resin, at least one of the melting point of the heat-resisting material and a glass transition temperature (Tg) thereof may be 80° C. or higher. For example, the heat-resisting material may include at least one of, for example, polypropylene, polyether ether ketone (PEEK), polyethylene, polyimide, sulfone-based resin, fluorine-based resin, and aramid. The sulfone-based resin may include a resin such as polyethylsulfone or polyphenylene sulfide, and the fluorine resin may include polytetrafluoroethylene (teflon).

However, the heat-resisting material is not limited thereto. For example, the heat-resisting material may be an arbitrary suitable material capable of withstanding heat of 80° C. or higher, or the heat-resisting material may be an arbitrary suitable material capable of withstanding heat of 100° C. or higher. For example, the heat-resisting material may be an arbitrary suitable material capable of withstanding heat of 150° C. or higher. For example, the heat-resisting material may be an arbitrary suitable material capable of withstanding heat of 200° C. or higher. For example, the heat-resisting material may be an arbitrary suitable material capable of withstanding heat of 300° C. or higher. For example, the heat-resisting material may be an arbitrary suitable material capable of withstanding heat of 400° C. or higher.

The first air gap 530 may be an air gap between the flexible heater 420 and the internal housing 520, and the second air gap 540 may be an air gap between the internal housing 520 and the external housing 510. Heat transfer from the flexible heater 420 to the internal housing 520 may be reduced by the first air gap 530, and heat transfer from the internal housing 520 to the external housing 510 may be reduced by the second air gap 540. Accordingly, external heat loss of the aerosol generating device 10000 may be minimized.

The aerosol generating device 10000 may include a heat-insulation part on at least one of respective inner and outer surfaces of the external housing 510 and the internal housing 520. The heat-insulation part may include at least one heat-insulation material. For example, the first heat-insulation part 550 and the second heat-insulation part 560 may include an arbitrary suitable material that blocks movement of heat via the first insulation part 550 and the second insulation part 560. For example, the first heat-insulation part 550 and the second heat-insulation part 560 may include, but are not limited to, at least one material of a porous material, graphite, and ceramic. The ceramic may be porous ceramic.

Referring to FIG. 5, the first heat-insulation part 550 is located in contact with the inner surface of the external housing 510, and the second insulation part 560 is located in contact with the outer surface of the internal housing 520. However, this is merely an example, and the first heat-insulation part 550 may be located in contact with the outer surface of the external housing 510, and the second insulation part 560 may be located in contact with the inner surface of the internal housing 520. Also, a heat-insulation material may be applied to all of the respective inner and outer surfaces of the external housing 510 and the internal housing 520.

The aerosol generating device 10000 according to the present disclosure includes the first and second air gaps 530 and 540 and the internal housing 520 between the external housing 510 forming the exterior of the aerosol generating device 10000 and the flexible heater 420, and heat-insulation materials are applied to at least one of the respective inner and outer surfaces of the external housing 510 and the internal housing 520 of the aerosol generating device 10000. Therefore, the heat generated by the flexible heater 420 may be effectively prevented from being lost to the outside of the aerosol generating device 10000.

It will be understood by those of ordinary skill in the art that various changes in form and details may be made to the exemplary embodiments without departing from the intrinsic characteristics of the above descriptions. It should be understood that the disclosed methods should be considered in a descriptive sense only and not for purposes of limitation. Therefore, the scope of the present disclosure is defined not by the detailed description of the present disclosure but by the appended claims, and all differences within the scope will be construed as being included in the present disclosure.

The invention claimed is:

1. An aerosol generating device comprising:
   a thermally conductive element that has a cylindrical shape and includes an accommodation space for accommodating a cigarette;
   a flexible heater that surrounds at least a portion of an outer surface of the thermally conductive element;
   an adhesion member that surrounds an outer surface of the flexible heater such that the flexible heater closely adheres to the thermally conductive element; and
   a battery configured to supply power to the flexible heater,
   wherein the aerosol generating device further comprises:
   an external housing that forms an exterior of the aerosol generating device; and
   at least one air gap and at least one internal housing which are disposed between the external housing and the flexible heater.

2. The aerosol generating device of claim 1, wherein the adhesion member has elastic force directed inward or has a property of shrinking as a temperature increases.

3. The aerosol generating device of claim 1, wherein the adhesion member comprises at least one of a heat-resistant synthetic resin, polytetrafluoroethylene (Teflon), and silicon.

4. The aerosol generating device of claim 1, wherein the thermally conductive element comprises copper, nickel, iron, chromium, or an alloy made from copper, nickel, iron, or chromium.

5. The aerosol generating device of claim 1, wherein the flexible heater comprises a heat-resistant resin film and an electrically conductive track.

6. The aerosol generating device of claim 1, wherein the external housing and the at least one internal housing comprise a heat-resisting material.

7. The aerosol generating device of claim 6, wherein the heat-resisting material comprises a material capable of withstanding heat of 80° C. or higher.

8. The aerosol generating device of claim 6, wherein the heat-resisting material comprises a heat-resistant polymer having a melting point or a glass transition temperature that is 80° C. or higher.

9. The aerosol generating device of claim 1, further comprising a heat-insulation part provided on at least one of inner and outer surfaces of the external housing and the at least one internal housing.

10. The aerosol generating device of claim 9, wherein the heat-insulation part comprises at least one of a porous material, graphite, and ceramic.

* * * * *